United States Patent [19]
Lippitt

[11] Patent Number: 6,010,828
[45] Date of Patent: *Jan. 4, 2000

[54] METHOD OF AND DEVICE FOR PLANARIZING A SURFACE OF A SEMICONDUCTOR WAFER

[75] Inventor: Maxwell W. Lippitt, Orlando, Fla.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 09/026,447

[22] Filed: Feb. 19, 1998

[51] Int. Cl.$^7$ ............................................. G03F 7/00
[52] U.S. Cl. ...................... 430/313; 430/269; 430/323; 430/396
[58] Field of Search ..................... 430/269, 313, 430/323, 322, 396, 945

[56] References Cited

U.S. PATENT DOCUMENTS

| | | | |
|---|---|---|---|
| 4,575,330 | 3/1986 | Hull | 425/174.4 |
| 5,447,822 | 9/1995 | Hull et al. | 430/269 |
| 5,747,221 | 5/1998 | Kim et al. | 430/311 |
| 5,773,367 | 6/1998 | Jen | 438/734 |
| 5,804,514 | 9/1998 | Kwon | 438/697 |

*Primary Examiner*—Sharon Gibson
*Assistant Examiner*—Jill N. Holloman

[57] ABSTRACT

The present invention provides a method of and a device for planarizing a photosensitive material, such as a photoresist, located over an irregular surface of a semiconductor wafer. In one embodiment, the method comprises the steps of passing radiation through a first medium and a second medium wherein the first medium is interfaced with the second medium. The method further comprises the steps of passing the radiation from the second medium into the photosensitive material that is interfaced with the second medium to expose the photosensitive material. The first and second mediums and the photosensitive material have radiation absorption coefficients such that the radiation terminates substantially within a plane of the photosensitive material. The method further includes the step of etching the exposed photosensitive material to the plane.

14 Claims, 1 Drawing Sheet

METHOD OF AND DEVICE FOR PLANARIZING A SURFACE OF A SEMICONDUCTOR WAFER

TECHNICAL FIELD OF THE INVENTION

The present invention is directed, in general, to a method of planarizing a surface on an semiconductor wafer, and, more specifically, to a method of planarizing an irregular surface of an integrated circuit by uniformly exposing a photosensitive material substantially within a plane of the photosensitive material.

BACKGROUND OF THE INVENTION

Throughout the evolution of integrated circuits, the aim of device scaling has been to increase circuit performance and to increase the functional complexity of the circuits. At the outset, scaling down of active device sizes was a very effective means of achieving these goals. Eventually, however, the scaling of active devices became less profitable, as the limitations of the circuit speed and maximum functional density depends more on the characteristics of the interconnects than on the scaled devices. In addition, the aspects of silicon utilization, chip cost, and ease and flexibility of integrated circuit design have also been adversely affected by the interconnect technology restrictions. The solution to lifting these limitations have predominantly involved the implementation of multilevel-interconnect schemes.

In the course of integrated circuit evolution, the maximum number of devices per chip has steadily increased, mainly as a result of the increase in functional density. Typically, functional density is defined as the number of interconnected devices per chip area, while the number of devices per chip area is referred to as the active device density. As the minimum feature size on integrated circuits has decreased, the active device density has also increased. Eventually, the condition has been reached in which the minimum chip area has become interconnect limited—that is, the area needed to route the interconnect lines between the active devices has exceeded the area occupied by the active devices. Thus continued shrinking of active devices has produced less circuit performance benefits. To overcome this problem, multilevel-interconnection within the integrated circuits has been implemented, and as additional levels are added to multilevel-interconnection schemes and circuit features are scaled to submicron dimensions, the required degree of planarization is increased.

The term planarization is generally well known to those skilled in the art. Those skilled in the art are also familiar with the fact that there are varying degrees of planarization. For a more thorough discussion of this topic, see S. Wolf's, *Silicon Processing for the VLSI Era, Vol. 2*, which is incorporated herein by reference. A planarized surface, as used herein, shall mean a substantially planar surface—that is, it is a surface that typically is greater than ninety percent (90%) planar, rather than absolutely planar. Such planarization may be implemented in either the conductor or the dielectric layers. As the number of levels in an interconnect technology is increased, the stacking of additional layers on top of one another produces a more and more rugged topography. Therefore, it is apparent that the surface of the wafer must be planarized to lessen this roughness in subsequent levels. Without such planarization, the microscopic recessed areas that result on the wafer surface from the stacking of device features can lead to topography conditions that would eventually reduce the yield of circuits to unacceptably small values.

To over come these problems, various planarization techniques are now used to achieve a high degree of global planarization. One such technique is chemical mechanical polishing (CMP), which consists of a combination of applying chemicals to the dielectric layer followed by mechanically scrubbing the wafer. This expensive process removes a portion of the overlying dielectric across the wafer and results in a relatively global planarization.

Many problems arise, however, when a CMP process is employed during wafer planarization. Significant deviation from global planarity results due to pattern density effects. Where there is a high density of interconnect structures, CMP will not deliver a substantially uniform surface as the dielectric still exhibits effects of the underlying topology. To counter these topological effects, a thick layer of dielectric must be employed as the CMP process consequently removes a sizable portion of much of the coating. Subsequently, the overlying layer's thickness will vary with the underlying metal pattern density.

Additionally, use of CMP processes result in severe variations in dielectric across the wafer. Since there are significant buildups of the overlying layer in areas with a high density of metal interconnect structures, other areas of the wafer may experience disproportionate dielectric deposition. A thick dielectric layer combined with a large amount of the layer's removal required for conventional CMP commonly results in a significant wafer-wide lack of planarity.

Employing a CMP process in planarization also results in significant wafer to wafer and lot to lot variability on the remaining oxide due to systematic changes in CMP polish rate with number of wafers polished. The CMP process must be closely monitored throughout the production and customized each time a different device is produced. This results in high production costs and lost time as the fabrication equipment must be re-calibrated with each successive lot of wafers.

Accordingly, what is needed in the art is a method for planarizing an irregular surface of a semiconductor wafer that avoids the problems associated with prior art methods.

SUMMARY OF THE INVENTION

To address the above-discussed deficiencies of the prior art, the present invention provides a method of planarizing a photosensitive material, such as a photoresist, located over an irregular surface of a semiconductor wafer. In one embodiment, the method comprises the steps of passing radiation through a first medium and a second medium wherein the first medium is interfaced with the second medium. The method further comprises the steps of passing the radiation from the second medium into the photosensitive material that is interfaced with the second medium to expose the photosensitive material. The first and second mediums and the photosensitive material have radiation absorption coefficients such that the radiation terminates substantially within a plane of the photosensitive material. The method further includes the step of etching the exposed photosensitive material to the plane.

In one embodiment, the step of passing the radiation through the first medium includes passing the radiation through a transparent glass plate that is positioned over the semiconductor surface and that forms a substantially flat interface with the second medium. In yet another embodiment, the step of passing the radiation through the second medium includes passing the radiation through a fluid medium, such as water or gas.

In an advantageous embodiment several different aspect may be present. For example, the first and second mediums and the photosensitive material may have substantially equal refractive indices, which allows a minimal amount of refraction to occur during the radiation step. This, of course, minimizes radiation scattering and promotes uniform exposure of the photosensitive material. A laser may be used as the radiation source. Additionally, the method may further comprise the step of positioning the semiconductor wafer substantially parallel to the first medium, which also promotes uniform exposure of the photosensitive material within a common plane.

In another embodiment, the method may further comprise the step of positioning the photosensitive material a predetermined distance from the first medium with the predetermined distance being a function of an exposure photon length of the photosensitive material. The method of the present invention may further comprise the step of etching into the irregular surface of the semiconductor wafer to substantially planarize it.

In yet another aspect of the present invention, there is provided a system for substantially planarizing a photosensitive material, such as a photoresist, located over an irregular surface of a semiconductor wafer. The system, in an advantageous embodiment, comprises a semiconductor wafer housing having a platform located therein and a semiconductor wafer secured thereon, a first medium positioned a predetermined distance from the photosensitive material and interfaced with a second medium that is positioned between the first medium and the photosensitive material. The second medium is interfaced with the photosensitive material and preferably conforms to the surface of the photosensitive material. The first and second mediums and the photosensitive material have radiation absorption coefficients such that said radiation terminates substantially within a plane of said photosensitive material.

In an advantageous embodiment, the first medium is a transparent glass plate that is positioned over the semiconductor wafer and that forms a substantially flat interface with the second medium. In another aspect, the second medium is a fluid medium selected from the group consisting of liquid or gas. Preferably, the first and second mediums and the photosensitive material have substantially equal refractive indices. The first medium may also be positioned substantially parallel to the semiconductor wafer.

In another embodiment, the first medium may be positioned a predetermined distance from the photosensitive material with the predetermined distance being a function of a exposure photon length of the photosensitive material.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
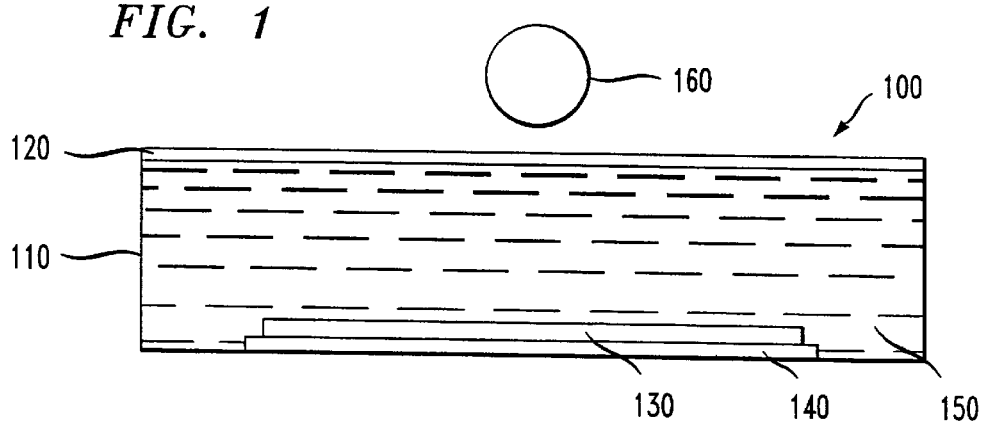
FIG. 1 illustrates an embodiment of the present invention, a system for planarizing a photosensitive material.

Referring initially to FIG. 1, illustrated is a cross-sectional view of one embodiment of a system for planarizing the surface of a semiconductor. The system 100 consists of a housing 110 with one side comprising a transparent plate 120 (commonly glass). The transparent plate 120 has a known refractive index and a known radiation absorption coefficient. For example, the transparent plate 120 may have a refraction index of 1.1–1.3 and a radiation absorption coefficient of approximately zero. In advantageous embodiments, the combination of the housing and the transparent plate form an enclosure that is both air-tight and liquid-tight. In another embodiment, however, the transparent plate 120 may not be present. In such embodiments, a transparent fluid medium, such as water or other liquid medium having the appropriate refractive index and radiation absorption coefficient may be positioned within the housing 110 between the semiconductor 130 and a radiation source. The semiconductor 130 is secured to a chuck 140 which is connected to the housing opposite the transparent plate 120. The semiconductor 130 is commonly secured to the chuck 140 by either suction or electrostatic force. The semiconductor 130 and the chuck 140 are located within a plane which is substantially parallel to the plane in which the transparent plate 120 rests. In those embodiments where the transparent plate 120 is not present, the semiconductor 130 and the chuck 140 are located within a plane that is substantially parallel to the plane of the transparent fluid medium. The plate 120 is a predetermined distance from the surface of the semiconductor 130.

The interior of the housing 110 contains a fluid medium 150 which can be either liquid (water) or gas, which has a known refractive index and a known radiation absorption coefficient. For example, the fluid medium 150 may have a refraction index of 1.3–1.7 and a radiation absorption coefficient of approximately 5%–20% through 1 micron of photoresist. The fluid medium 150 interfaces with both the transparent plate 120 and the semiconductor 130 and conforms to the surfaces of the plate 120 and the semiconductor 130. Above the housing 110, rests a radiation source 160, such as a laser, that delivers photonic radiation energy to the semiconductor 130 through the transparent plate 120 and the fluid medium 150.

Figure 2A:
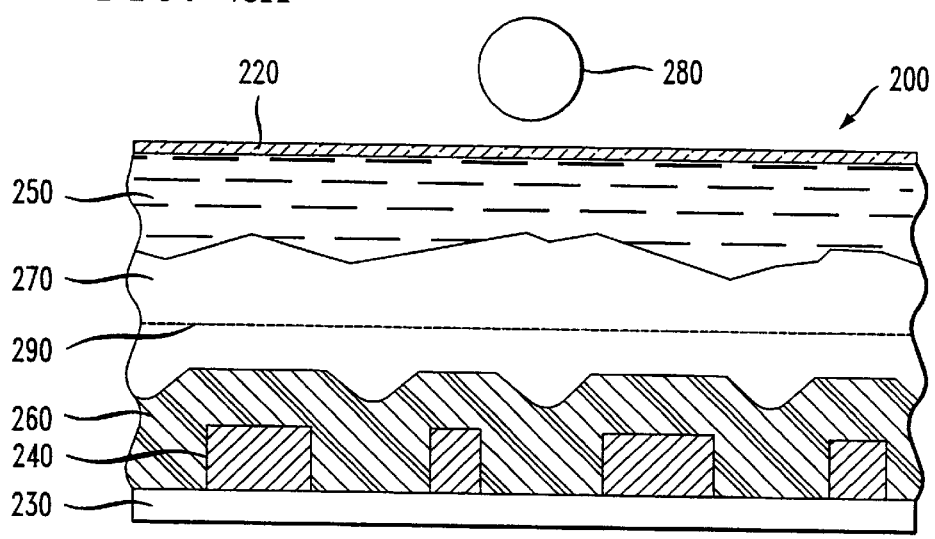
FIGS. 2A–2C illustrate a cross-sectional view of a semiconductor wafer during the procedural steps of an embodiment of the present invention.
Figure 2B:
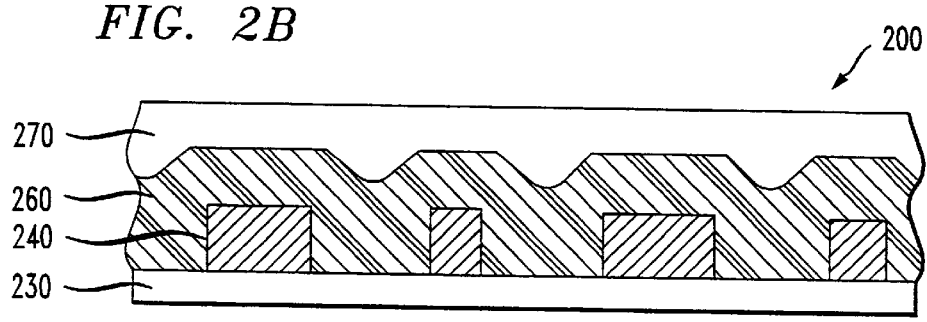
Figure 2C:
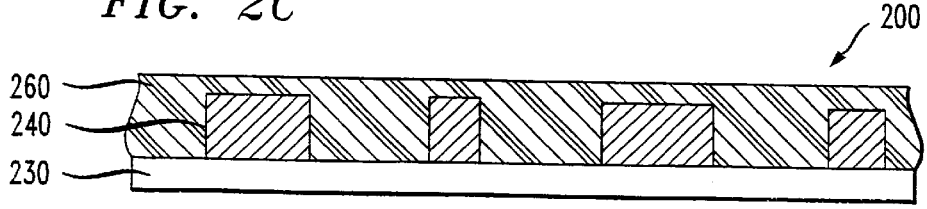

Turning now to FIGS. 2A–2C, with continued reference to FIG. 1, illustrated is a cross-sectional view of a semiconductor wafer during different procedural steps of an embodiment of the present invention. FIG. 2A shows a semiconductor 200 consisting of a wafer 230 resting within the system 100 of FIG. 1, and a plurality of structures, such as metal interconnects, one of which designated as 240, on top of the wafer 230 and over which is a dielectric layer 260. The surface of the dielectric layer 260 reflects the irregular topology of the underlying structures 240 in the form of recesses where there are no structures 240 and protrusions where there are structures 240. The irregular, non-planar dielectric surface 260 is covered with a photoresist 270, which also has an irregular topography.

Above the photoresist 270 is a fluid medium 250 and a transparent plate 220. The fluid medium 250 interfaces with both the transparent plate 220 and the photoresist 270 and conforms to the surfaces of the plate 220 and the photoresist 270. A light source 280 emits radiation, such as photons, which pass through the transparent plate 220. It is believed, that the transparent plate 220 sets a path of the photons that is perpendicular to the plane formed by the transparent plate 220 and significantly reduces any scattering effects. The photons pass from the transparent plate 220 through the fluid medium 250 until they contact the photoresist 270. The fluid medium 250 and the transparent plate 220 have refractive indices that are substantially equal to that of the photoresist 270. In an advantageous embodiment, a forty percent (40%) deviation is acceptable between these three indices.

The transparent plate is positioned a predetermined distance from the photoresist. This distance is calculated as a function of photon absorption through photoresist. With an absorption coefficient of approximately 5%–20%, this distance is from 5 microns to 20 microns. Those skilled in the art will understand that "absorption coefficient" refers to how much light (exposure dose in millijoules) is absorbed in the photoresist. The photons penetrate the photoresist 270 down to a previously calculated level that is substantially within a plane 290 (indicated by a dashed line) above the highest point of the dielectric layer 260. The plane 290 is relatively parallel to the planes of the semiconductor wafer 230 and the transparent plate 220. It is advantageous to reduce photon scattering, because should photons penetrate the photoresist 270 at an angle other than that desired, the photoresist 270 will not be exposed in a uniform plane. The plane's 290 position within the photoresist 270 is calculated by comparing the refractive indices and radiation absorption coefficients of the transparent plate 220 and the fluid medium 250 in combination with the absorption rate of the photoresist 270. It is believed that the substantial similarity of these refractive indices prevents the radiation from scattering that causes uneven exposure of the photoresist. Because the indices are similar, the radiation incurs little or no refraction as it passes from one medium to another, thus substantially reducing or eliminating scattering of the radiation as it penetrates the photoresist 270.

FIG. 2B illustrates the second step of the present process. The semiconductor 200 is removed from the system 100 and subjected to a conventional soft baking process. The photoresist, which was previously exposed down to the plane 290, is then developed and removed by conventional processes to form a photoresist layer 270 with a relatively planar surface. It should noted that this process, as opposed to the conventional CMP process discussed above, results in a planar surface that does not substantially reflect the underlying topography. This planar surface, then provides an improved starting point for planarizing the underlying dielectric level 260 as illustrated in FIG. 2C.

Turning now to FIG. 2C, there is illustrated the end result of semiconductor planarized by the present invention. Once the photoresist is exposed and partially removed, the semiconductor 200 undergoes a conventional resist etchback which removes the remaining photoresist and a portion of the dielectric layer 260. The result is a dielectric layer 260 which has a planarized surface, not showing any substantial effects of the underlying structures 240.

From the foregoing it can be seen that the present invention provides a method for planarizing a photosensitive material, such as a photoresist, located over an irregular surface of a semiconductor wafer. In one embodiment, the method comprises the steps of passing radiation through a first medium and a second medium wherein the first medium is interfaced with the second medium. The method further comprises the steps of passing the radiation from the second medium into the photosensitive material that is interfaced with the second medium to expose the photosensitive material. The first and second mediums and the photosensitive material have radiation absorption coefficients such that the radiation terminates substantially within a plane of the photosensitive material. The method further includes the step of etching the exposed photosensitive material to the plane.

In yet another aspect, the present invention provides a system for planarizing a photosensitive material, such as a photoresist, located over an irregular surface of a semiconductor wafer. The system, in an advantageous embodiment, comprises a semiconductor wafer housing having a platform located therein and a semiconductor wafer secured thereon, a first medium positioned a predetermined distance from the photosensitive material and interfaced with a second medium that is positioned between the first medium and the photosensitive material. The second medium is interfaced with the photosensitive material and preferably conforms to the surface of the photosensitive material. The first and second mediums and the photosensitive material have radiation absorption coefficients such that said radiation terminates substantially within a plane of said photosensitive material.

Although the present invention has been described in detail, those skilled in the art should understand that they can make various changes, substitutions and alterations herein without departing from the spirit and scope of the invention in its broadest form.

What is claimed is:

1. A method of planarizing a photosensitive layer located over an irregular surface of a semiconductor wafer, comprising:

passing radiation through a first medium and a second medium, said first medium interfaced with second medium;

passing said radiation from said second medium into said photosensitive layer interfaced with said second medium to uniformly expose said photosensitive layer, said first and second mediums and said photosensitive layer having radiation absorption coefficients such that said radiation terminates substantially within a plane of said photosensitive layer; and etching said photosensitive material to said plane, whereby said photosensitive layer is substantially planarized at said plane.

2. The method as recited in claim 1 wherein passing said radiation through said first medium includes passing said radiation through a transparent glass plate positioned over said semiconductor surface, said transparent glass plate forming a substantially flat interface with said second medium.

3. The method as recited in claim 1 wherein passing said radiation through said second medium includes passing said radiation through a fluid medium.

4. The method as recited in claim 3 wherein said fluid medium is water or gas.

5. The method as recited in claim 1 wherein said first and second mediums and said photosensitive layer have substantially equal refractive indices.

6. The method as recited in claim 1 wherein passing radiation includes passing laser radiation through said first and second medium and into said photosensitive layer.

7. The method as recited in claim 1 further comprising positioning said semiconductor wafer substantially parallel to said first medium.

8. The method as recited in claim 1 further comprising positioning said photosensitive layer a predetermined distance from said first medium, said predetermined distance being a function of an absorption rate of said photosensitive layer.

9. The method as recited in claim 1 wherein said photosensitive layer is a photoresist.

10. The method as recited in claim 1 wherein said second medium conforms to a surface of said photosensitive layer.

11. The method as recited in claim 1 further comprising etching into said irregular surface to planarize said irregular surface.

12. A method for planarizing a photosensitive material located over an irregular surface of a semiconductor wafer, comprising:

positioning a first medium and a second medium substantially parallel to said semiconductor wafer, said second medium interfaced with said first medium;

positioning a photosensitive layer on said semiconductor wafer a predetermined distance from said first medium, said predetermined distance being a function of an absorption rate of said photosensitive material;

passing radiation through said first and second mediums and into said photosensitive layer to uniformly expose said photosensitive layer, said first and second mediums and said photosensitive layer having radiation absorption coefficients such that said radiation terminates substantially within a plane of said photosensitive layer; and etching said photosensitive layer to said plane, whereby said photosensitive layer is substantially planarized at said plane.

13. The method as recited in claim 12 wherein passing radiation through said first and second mediums includes passing laser radiation through first and second mediums wherein said first medium is a transparent glass plate and said second medium is a fluid.

14. The method as recited in claim 13 wherein passing laser radiation includes passing radiation through said first medium wherein said first medium has a refractive index between 1.1 and 1.3 and a radiation absorption coefficient in the range of 5–20% and said second fluid medium has a refractive index substantially equal to said first medium.

* * * * *